United States Patent
Li et al.

(10) Patent No.: US 6,261,966 B1
(45) Date of Patent: Jul. 17, 2001

(54) METHOD FOR IMPROVING TRENCH ISOLATION

(75) Inventors: Jui-ping Li, Yi-Lan Shein; Ping-wei Lin, Chia-Yi; Ming-kuan Kao, Hsinchu; Hui-ching Lin, Hsinchu, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/373,191

(22) Filed: Aug. 12, 1999

(51) Int. Cl.$^7$ ................................ H01L 21/3065
(52) U.S. Cl. .................. 438/706; 438/719; 438/723; 438/724; 438/743; 438/744
(58) Field of Search .................... 438/425, 424, 438/430, 689, 706, 723, 724, 725, 719, 743, 744

(56) References Cited

U.S. PATENT DOCUMENTS 5,770,484 * 6/1998 Kleinhenz ............................ 438/155
5,783,476 * 7/1998 Arnold ................................. 438/425
5,994,200 * 11/1999 Kim ..................................... 438/425

* cited by examiner

*Primary Examiner*—Benjamin L. Utech
*Assistant Examiner*—Binh X. Tran
(74) *Attorney, Agent, or Firm*—Bacon & Thomas

(57) ABSTRACT

A method for improving trench isolation is disclosed. A trench is etched into the substrate by using a photo mask. A bottom oxide layer, a sidewall oxide layer and a polycrystalline silicon layer are deposited into the trench and over the wafer, and are etched to clear from the surface, then over-etched till a recess is formed within the trench. Thereafter, an oxide etch step is applied to remove a certain thickness of the sidewall oxide layer in order to expose the polycrystalline silicon edge in the opening of the trench. Then, an oxidation step is utilized to form a capping oxide layer on top of the recess by oxidizing the top and the exposed edge of the polycrystalline silicon film in the trench so that a uniform plug edge can be achieved inside the trench to prevent stress problem induced by a wedge shaped oxide growing in the space between the plug and the substrate.

7 Claims, 3 Drawing Sheets

METHOD FOR IMPROVING TRENCH ISOLATION

FIELD OF THE INVENTION

The present invention relates to a process for electrically isolating semiconductor devices and components in integrated circuits. In particular, the invention is a process for forming a trench isolation which can prevent the leakage problem induced by a wedge shaped insulating layer inside the trench.

BACKGROUND OF THE INVENTION

Modern isolation techniques have used trenches etched into the semiconductor substrate. A common trench isolation approach involves variations on the basic sequence of etching the trench, forming a thin oxide layer on the trench sidewalls, then filling the trench with polycrystalline silicon. For example, U.S. Pat. No. 4,104,086 to Bondur et al. uses tapered trench sidewalls to control the depth of any voids in relation to the substrate surface and forms a composite dielectric inside the trench.

U.S. pat. No. 4,356,211 to Riseman also forms an oxide layer in the trench, but then deposits a conformal layer of polycrystalline silicon. The polycrystalline silicon is implanted so that differential oxidation of the polycrystalline silicon near the surface of the trench encloses the trench and the underlying voids.

U.S. pat. No. 4,835,115 issued on May 30, 1989, to Eklund for "Method for forming oxide capped trench isolation" teaches a method for preventing the leakage problem from overlying contact to the polycrystalline silicon plug by forming an oxide-capped trench isolation.

The trench isolation provided in these examples use a polycrystalline silicon plug within the trench to overcome the problems of localized stress from trench arising due to the dissimilarity of the coefficients of thermal expansion of the substrate (e.g. silicon) to the insulator (e.g. silicon dioxide), as well as the stress from the formation of a filling oxide. The polycrystalline silicon plug filling the trench after formation of the sidewall dielectrics serves to minimize the stress, as it minimizes the formation and volume of the oxide within the trench.

However, it is beneficial to provide a thick dielectric layer over the top of the polycrystalline silicon plug in the trench in order to prevent from the leakage from the overlying layer to the polycrystalline silicon plug caused by over-etching, e.g. the contact via, into polycrystalline silicon plug.

Variations on the common approach of filling the trench with polycrystalline silicon, planarizing the polycrystalline silicon by an etch back or polishing, and oxidizing the polycrystalline silicon to form a capping oxide layer are disclosed in Goto et al. An oxide layer is grown over the trench after it has been filled with a polycrystalline silicon plug. While resulting in a thicker oxide over the filled trench, such oxide growth creates significant stress on the trench structure during its growth. This stress results from the growth of oxide at the sidewalls at the trench and at the plug, near the top of the trench. In effect, a wedge of oxide is attempting to grow in the space between the plug and the substrate, such space already containing a sidewall oxide, resulting in similar stress problems as that encountered at the bird's beak of local oxidation of silicon (LOCOS) isolation. Such a stress problem can seriously induce a leakage problem to the trench isolation and increase the parasitic capacitor thereof to decrease the response time of transistors.

It is therefore an object of this invention to provide a method for fabricating an integrated circuit using trench isolation that overcomes the above problems.

SUMMARY OF THE INVENTION

The invention may be incorporated into a method for fabricating trench isolation in an integrated circuit. A trench is etched at the desired region, and a sidewall insulator is provided. The wafer is then covered with a layer of deposited polycrystalline silicon, which also fills the trench. The polycrystalline silicon is then etched from the wafer surface (stopping on an underlying oxide layer), and is over-etched to create a recess in the plug to a predetermined depth. Thereafter, an oxide etch step is applied to remove a certain thickness of the sidewall oxide layer in order to expose the polycrystalline silicon edge in the opening of the trench. Then, the polycrystalline silicon inside the trench is oxidized to form a capping oxide layer on top of the recess by oxidizing the top and the exposed edge of the polycrystalline silicon film in the trench so that a uniform plug edge can be achieved inside the trench to prevent the stress and leakage problems induced by a wedge shaped oxide growing in the space between the plug and the substrate. Thus, it can eliminate the problems, such as the increase of stress, leakage current and transistor response time, as described in the prior art.

BRIEF DESCRIPTION OF THE DRAWINGS

The above and other objects and the features and effects of the present invention can be best understood by referring to the following detailed descriptions of the preferred embodiment and the accompanying drawings, in which.

DETAILED DESCRIPTION OF THE PREFERRED EMBODIMENTS

Figure 1:
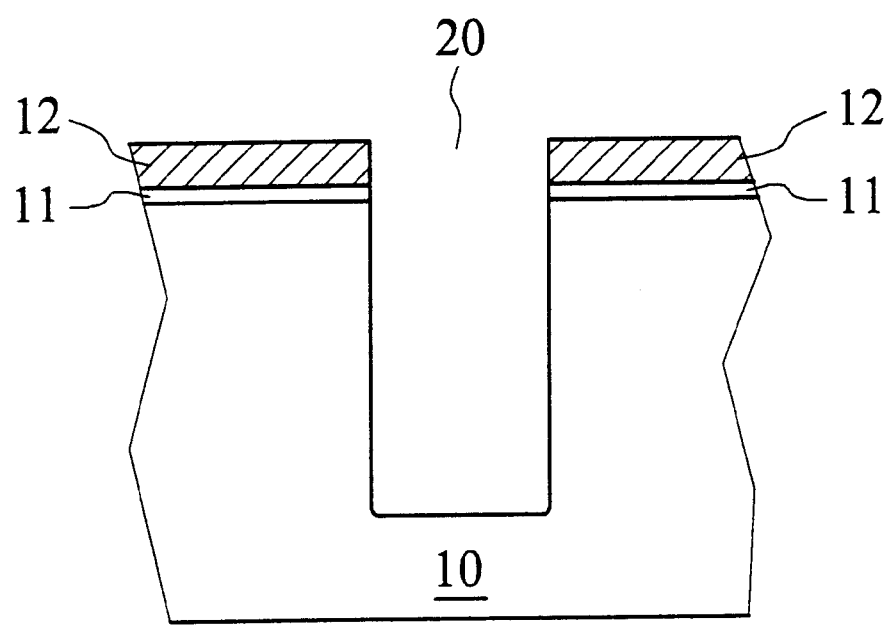
FIG. 1 is a cross-sectional view of a single crystal silicon substrate with a masking layer.
Figure 2A:
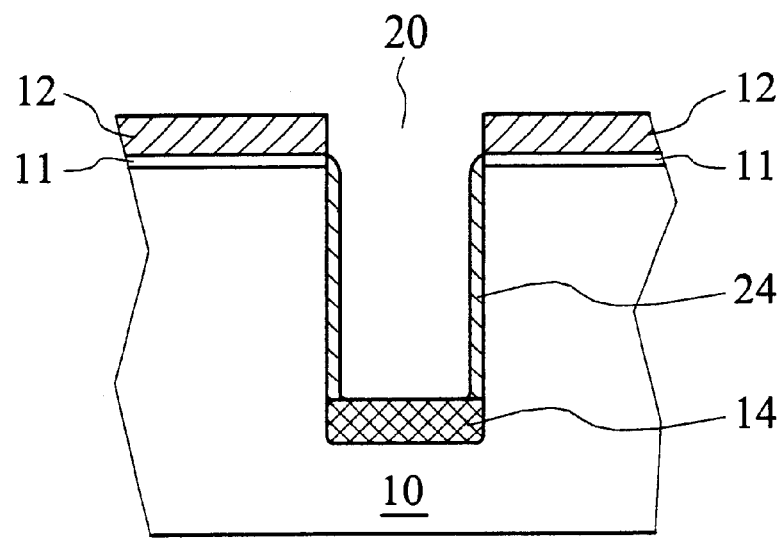
FIGS. 2A through 2D are cross-sectional views illustrating various steps of the fabrication of trench isolation according to the invention.

FIG. 1 is a cross-sectional view of a single crystal silicon substrate 10 with a masking layer. A masking layer consisting of a silicon oxide layer 11 covered by a silicon nitride layer 12 is formed according to any one of a number of well-known techniques; for example, the silicon oxide layer 11 may be a grown oxide having a nominal thickness in the range of 10 nm to 20 nm, and the nitride layer 12 may be deposited by low pressure chemical vapor deposition (LPCVD) to nominally 150 nm to 250 nm thick. Photoresist (not shown) is then used to define the pattern for the trench, and the silicon nitride layer 12 and the silicon oxide layer 11 are etched to expose a portion of the silicon substrate 10 through which a trench 20 is etched to a depth of 1.5 to 2.0 microns by way of reactive ion etch (RIE), according to well known trench etch techniques. Then an oxide layer 14 is deposited on the bottom of trench 20. The oxide layer 14 is formed by high-density plasma (HDP) deposition that uses ozone-TEOS as a reactant. Then a thin oxide layer 24 is thermally grown on the sidewalls of the trench with a thickness of 100 to 1000 angstroms as shown in FIG. 2A.

Figure 2B:
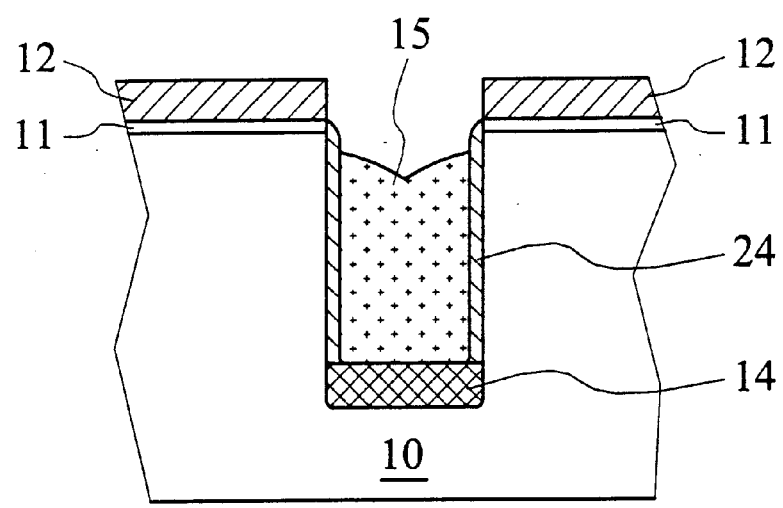

After growth of the sidewall oxide layer 24, the trench 20 is filled with a polycrystalline silicon plug 15, formed by chemical vapor deposition (CVD) of a polycrystalline silicon layer over the entire surface of the wafer. A planarized etch of the polycrystalline silicon layer 15 is performed and stopped at the surface of the wafer, then the etch is continued so that the polycrystalline silicon plug 15 inside the trench 20 is recessed to a predetermined depth (e.g. in a range of 0.2 micron to 0.3 micron), as shown in FIG. 2B.

Figure 2C:
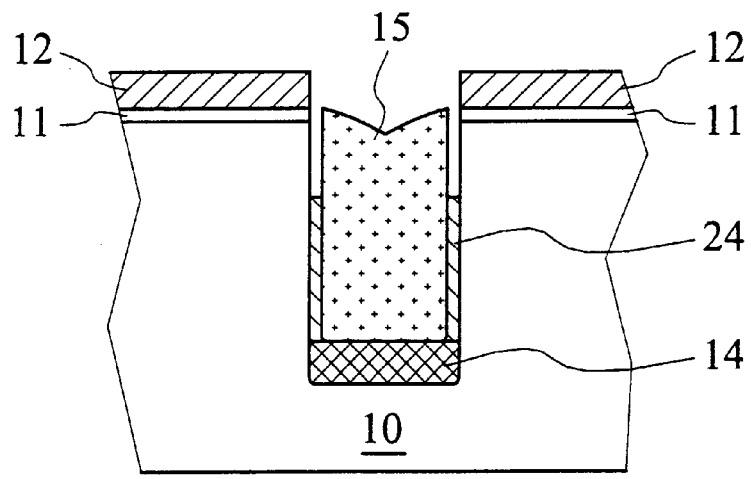
Figure 2D:
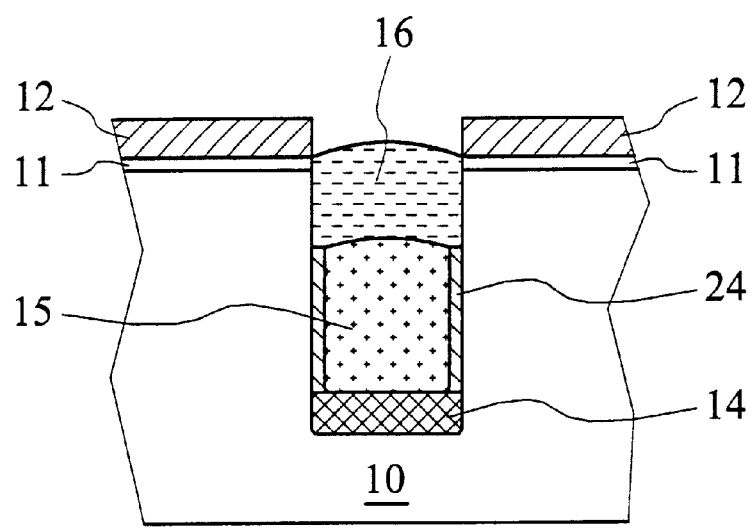

Thereafter, an oxide etch step is applied to remove a certain thickness of the sidewall oxide layer 24 in order to expose the edge of the polycrystalline silicon plug 15 in the opening of the trench, as shown in FIG. 2C. Such an oxide etch step may be achieved by wet etching method with HF as the main etchant. And the oxide loss is controlled in the thickness range of 30 nm to 50 nm. Then, as shown in FIG. 2D, an oxidation step is utilized to form a capping oxide layer 16 on top of the recess by oxidizing the top and the exposed edge of the polycrystalline silicon plug 15 in the trench so that a uniform plug edge can be achieved inside the trench.

The filling of the trench 20 with a polycrystalline silicon plug 15 provides a structure which adds minimal stress to the integrated circuit, since polycrystalline silicon and single crystal silicon expand and contract at substantially the same rate during temperature cycling. It should be noted that the trench structure resulting from the method described above allows for subsequent metal to metal or metal to polysilicon contacts to be made directly above the trench 20, because the thick oxide within the recess of the trench 20 minimizes the risk of over-etching the contact via into the polycrystalline silicon plug 15 and causing leakage current from the overlying layer. Also it provides for a low stress fill of the trench for preventing the problems in the prior techniques that a wedge shaped silicon oxide is formed near the surface of the structure having stress-induced leakage potential at the silicon-silicon oxide interface at the top of trench 20. Also the parasitic capacitor can be reduced due to thinner capacitor dielectrics is formed between the polycrystalline plug 15 and silicon substrate 10 by smoothing the extruded edge into round-shaped and so that the response time of transistor can be improved.

Although the invention has been described in detail herein with reference to its preferred embodiment, it is to be understood that this description is by way of example only, and is not to be construed in a limiting sense. Various modifications and applications can be made without departing from the true spirit and scope of the invention as defined by the appended claims.

What is claimed is:

1. A method for forming an isolation region for an integrated circuit at a surface of a semiconductor body, comprising:

etching a trench into said semiconductor body at a predetermined location of said surface;

forming a high density plasma oxide layer on the bottom of said trench;

forming a first dielectric layer over the sides of said trench;

forming a plug in said trench over said first dielectric layer, the top of said plug being below the top of said trench;

exposing the edge of said plug in the opening of said trench; and oxidizing said plug to form a second dielectric layer over the top and the exposed edge of said plug, said second dielectric layer substantially filling a portion of said trench from which said plug is recessed.

2. The method in accordance with claim 1, wherein said step of exposing said plug edge in the opening of said trench comprises removing said first dielectric layer around said plug in the opening of said trench in a thickness range 150 nm to 250 nm.

3. The method in accordance with claim 1, further comprising:

forming a buffer layer of silicon oxide over said substrate;

forming a hard mask of silicon nitride over said buffer layer;

forming a photoresist pattern over said hard mask layer to define a location at which said isolation structure is to be formed; and etching said trench.

4. The method in accordance with claim 3, wherein said step of etching said trench comprises:

etching said hard mask layer and said buffer layer to expose a location of said surface lying thereunder; and etching through said location of said surface.

5. The method in accordance with claim 1, wherein said step of forming said plug comprises:

depositing a layer of conductive material over said surface of said semiconductor body, said semiconductor layer filling said trench; and etching said conductive layer so that said conductive layer is recessed into said trench.

6. The method in accordance with claim 5, wherein said step of etching the conductive layer clears said conductive layer from said surface of said semiconductor body.

7. The method in accordance with claim 6, wherein said conductive layer comprises polycrystalline silicon.

* * * * *